(12) United States Patent
Metzger-Brueckl et al.

(10) Patent No.: US 10,913,656 B2
(45) Date of Patent: Feb. 9, 2021

(54) METHOD FOR SEALING AN ACCESS OPENING TO A CAVITY AND MEMS COMPONENT COMPRISING A SEALING ELEMENT

(71) Applicant: Infineon Technologies AG, Neubiberg (DE)

(72) Inventors: Gerhard Metzger-Brueckl, Geisenfeld (DE); Alfons Dehe, Villingen Schwenningen (DE); Uwe Hoeckele, Regensburg (DE); Johann Strasser, Schierling (DE); Arnaud Walther, Unterhaching (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/162,026

(22) Filed: Oct. 16, 2018

(65) Prior Publication Data

US 2019/0112182 A1    Apr. 18, 2019

(30) Foreign Application Priority Data

Oct. 18, 2017  (DE) .................. 10 2017 218 635

(51) Int. Cl.
*B81B 7/02* (2006.01)
*B81C 1/00* (2006.01)

(52) U.S. Cl.
CPC .............. *B81B 7/02* (2013.01); *B81C 1/00182* (2013.01); *B81C 1/00293* (2013.01);
(Continued)

(58) Field of Classification Search
CPC ............ B81C 1/00182; B81C 1/00293; B81C 2201/0178; B81C 2201/0181; B81B 7/02;
(Continued)

(56) References Cited

U.S. PATENT DOCUMENTS 4,430,149 A * 2/1984 Berkman ................ C23C 16/54
117/102
6,030,881 A * 2/2000 Papasouliotis ........ C23C 16/045
257/E21.546
(Continued)

FOREIGN PATENT DOCUMENTS

DE    102008002332 A1    12/2009
DE    102008040970 A1    2/2010

*Primary Examiner* — Dale E Page
*Assistant Examiner* — Quovaunda Jefferson
(74) *Attorney, Agent, or Firm* — Slater Matsil, LLP

(57) ABSTRACT

A method for sealing an access opening to a cavity comprises the following steps: providing a layer arrangement having a first layer structure and a cavity arranged adjacent to the first layer structure, wherein the first layer structure has an access opening to the cavity, performing a CVD layer deposition for forming a first covering layer having a layer thickness on the first layer structure having the access opening, and performing an HDP layer deposition with a first and second substep for forming a second covering layer on the first covering layer, wherein the first substep comprises depositing a liner material layer on the first covering layer, wherein the second substep comprises partly back-sputtering the liner material layer and furthermore the first covering layer in the region of the access opening, and wherein the first and second substeps are carried out alternately and repeatedly a number of times.

20 Claims, 7 Drawing Sheets

(52) U.S. Cl.
CPC ............... *B81B 2201/0257* (2013.01); *B81B 2201/0264* (2013.01); *B81B 2203/0127* (2013.01); *B81B 2203/0315* (2013.01); *B81C 2201/0178* (2013.01); *B81C 2201/0181* (2013.01); *B81C 2203/0145* (2013.01)

(58) Field of Classification Search
CPC .... B81B 2203/0315; B81B 2203/0127; B81B 2201/0257; B81B 2201/0263; B81B 2230/0145
See application file for complete search history.

(56) References Cited

U.S. PATENT DOCUMENTS

| | | | |
|---|---|---|---|
| 6,180,536 B1* | 1/2001 | Chong | B81C 1/00587 366/DIG. 3 |
| 2006/0057755 A1* | 3/2006 | Weber | B81C 1/00158 438/48 |
| 2007/0178660 A1* | 8/2007 | Miller | H01L 21/763 438/424 |
| 2009/0215214 A1 | 8/2009 | Renault | |
| 2010/0028618 A1 | 2/2010 | Gonska et al. | |
| 2011/0147864 A1* | 6/2011 | Kramer | B81C 1/00158 257/419 |
| 2013/0134530 A1 | 5/2013 | Kautzsch et al. | |

* cited by examiner

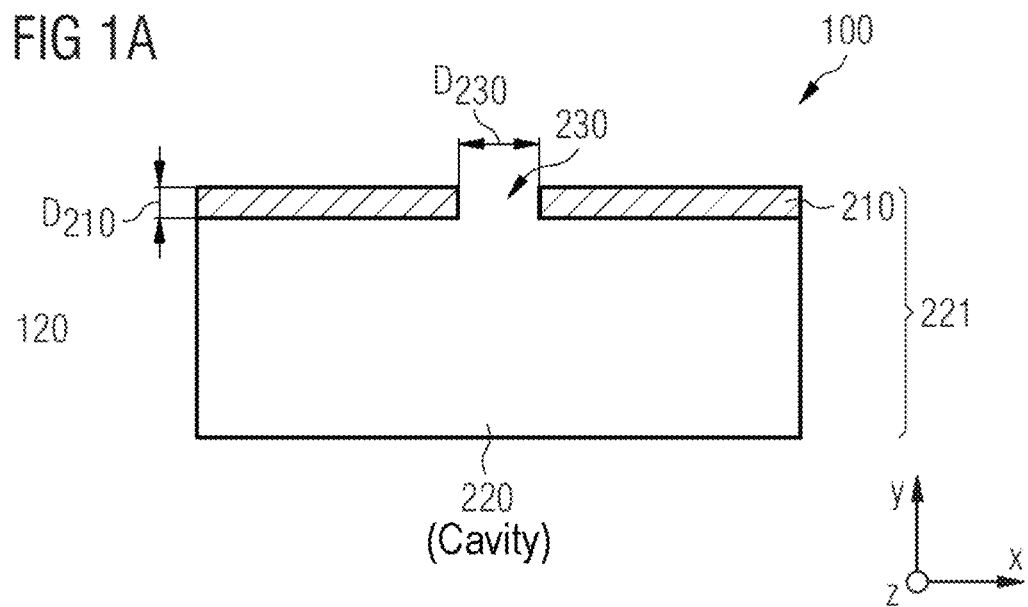
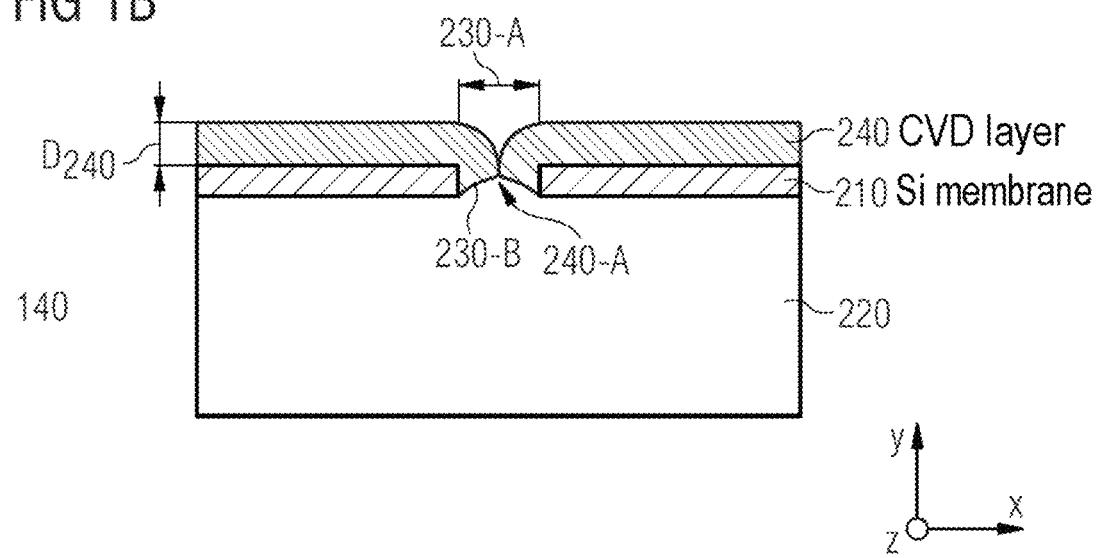

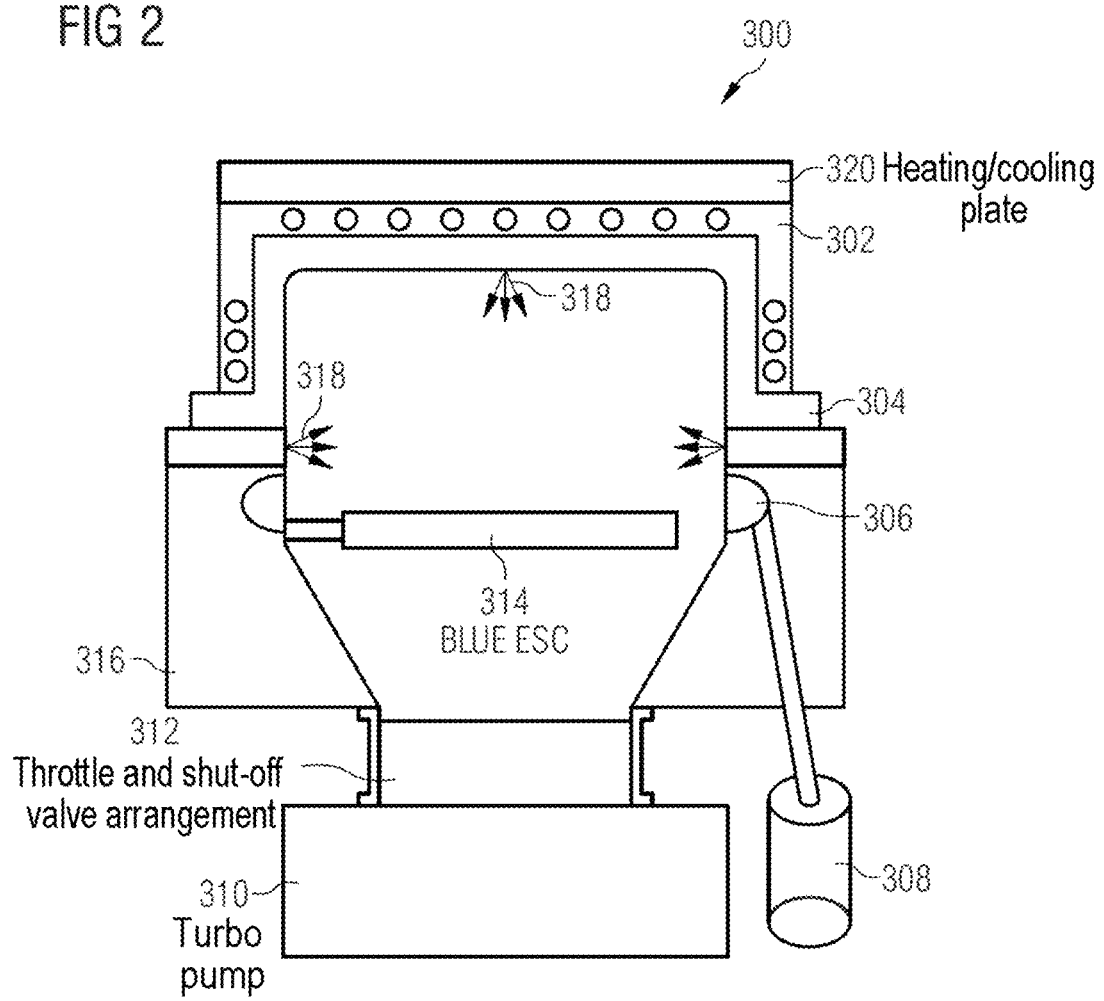

CVD application - overhanging film in the vicinity of the opening, but no hermetic sealing Structuring the "sealing element"

Structuring the "sealing element"

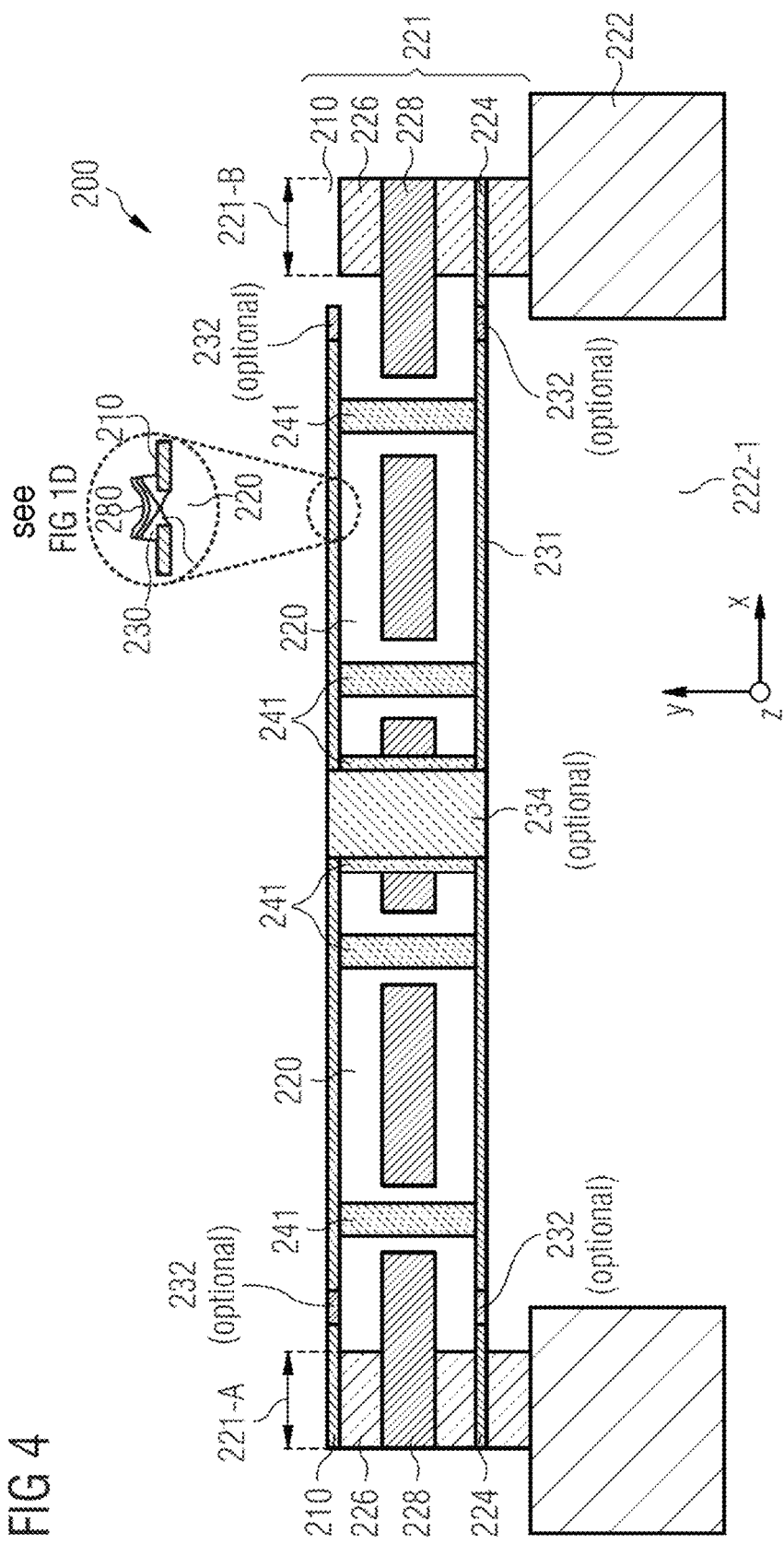

METHOD FOR SEALING AN ACCESS OPENING TO A CAVITY AND MEMS COMPONENT COMPRISING A SEALING ELEMENT

This application claims the benefit of German Application No. 102017218635.6, filed on Oct. 18, 2017, which application is hereby incorporated herein by reference in its entirety.

TECHNICAL FIELD

This disclosure generally relates to a method for sealing an access opening to a cavity and MEMS component comprising a sealing element.

BACKGROUND

MEMS components, such as e.g. acoustic MEMS sensors or MEMS microphones, are open components in a manner governed by their function and are thus exposed to the surrounding environment in order to detect e.g. sounds, noises etc. in the form of sound pressure changes in the environment. Therefore, such MEMS components are often also exposed to harsh ambient conditions, such as e.g. mechanical loads, impacts and also high sound pressures. In order to prevent a malfunction or a reduced performance of MEMS components, such as e.g. acoustic MEMS sensors, all elements and in particular the mechanically movable elements of the MEMS component should have a sufficient mechanical robustness in order to maintain the required functionality during the predefined lifetime within the application, e.g. within mobile devices such as smartphones, notebooks etc.

This applies in particular to MEMS components comprising a cavity having an atmospheric reduced pressure or a vacuum in which small access openings to the cavity are intended to be hermetically sealed, and this hermetic seal is intended to maintain the required functionality of the MEMS component securely and reliably even under harsh ambient conditions.

SUMMARY

In accordance with one exemplary embodiment, a method for sealing an access opening to a cavity comprises the following steps: providing a layer arrangement having a first layer structure and a cavity arranged adjacent to the first layer structure, wherein the first layer structure has an access opening to the cavity, performing a CVD layer deposition for forming a first covering layer having a layer thickness on the first layer structure having the access opening, and performing an HDP layer deposition with a first and second substep for forming a second covering layer on the first covering layer, wherein the first substep comprises depositing a liner material layer on the first covering layer, wherein the second substep comprises partly backsputtering the liner material layer and furthermore the first covering layer in the region of the access opening, and wherein the first and second substeps are carried out alternately and repeatedly a number of times.

In accordance with one exemplary embodiment, a MEMS component includes a layer arrangement having a first layer structure and a cavity arranged adjacent to the first layer structure, wherein the first layer structure has an access opening to the cavity, and a structured covering layer stack for forming a local sealing element at the through opening, wherein the local sealing element has a layer sequence comprising a CVD layer and an HDP layer.

In accordance with a further exemplary embodiment, a method of forming a MEMS component includes forming a layer arrangement having a first layer structure and a cavity arranged adjacent to the first layer structure, wherein the first layer structure has an access opening to the cavity; and forming a structured covering layer stack for forming a local sealing element at the access opening, wherein the local sealing element has a layer sequence comprising a CVD layer and an HDP layer.

BRIEF DESCRIPTION OF THE DRAWINGS

Exemplary embodiments of devices and/or methods are described in greater detail below by way of example with reference to the accompanying figures, in which:

FIGS. 1a-1d show exemplary process steps of a method for sealing a cavity, e.g. of a MEMS component, in accordance with one exemplary embodiment;

FIG. 2 shows one exemplary HDP process system with reference to specific process parameters for carrying out the method for sealing a cavity in accordance with one exemplary embodiment;

FIG. 4 shows a basic illustration of a MEMS component in the form of a vacuum microphone comprising a double-membrane arrangement for elucidating the method for sealing a cavity in accordance with one exemplary embodiment.

DETAILED DESCRIPTION OF ILLUSTRATIVE EMBODIMENTS

Figure 1C:
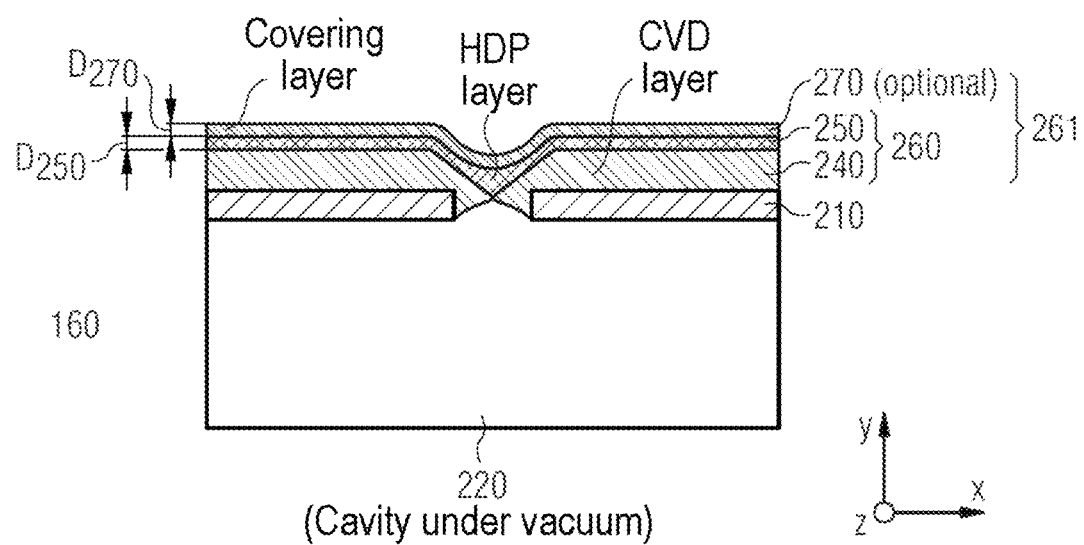

Before exemplary embodiments are explained more specifically in detail below with reference to the drawings and figures, it is pointed out that identical, functionally identical or identically acting elements, objects, function blocks and/or method steps are provided with the same reference signs in the different figures, such that the description of said elements, objects, function blocks and/or method steps as presented in different exemplary embodiments is mutually interchangeable or can be applied to one another.

Exemplary embodiments relate to a method for sealing an access opening to a cavity of a component, e.g. a release opening of a MEMS component or of a MEMS microphone, wherein the cavity can have e.g. an atmospheric reduced pressure, and furthermore relate to a corresponding MEMS component (MEMS=microelectromechanical system) comprising a sealed cavity having an atmospheric reduced pressure. Exemplary embodiments relate in particular to a production method for producing specially configured local sealing elements of the access opening(s) at a layer structure or membrane structure of a MEMS component, wherein the cavity is arranged adjacent to the layer structure. Exemplary embodiments thus relate to a hermetically sealed double-membrane microphone or a vacuum microphone comprising a double-membrane arrangement arranged on a carrier substrate and a counterelectrode structure situated therebetween, wherein the cavity between the two membrane elements has an atmospheric reduced pressure or a vacuum and is hermetically sealed.

In some embodiments, a MEMS component, such as e.g. a pressure sensor, an acoustic MEMS sensor or a MEMS microphone, and for a corresponding production method in which a cavity of the MEMS component firstly can be sealed with a high mechanical robustness, wherein furthermore the functionality, such as e.g. the acoustic behavior, of the MEMS component is maintained.

The explanations below relate by way of example to a method for sealing a cavity of a MEMS component e.g. in the form of a vacuum microphone having a hermetically sealed double-membrane configuration, but it is pointed out that said explanations are equally applicable to any components or MEMS components in which at least one or a plurality of access openings in a layer structure arranged adjacent to a cavity is/are intended to be hermetically sealed in a reliable manner.

MEMS components, such as e.g. MEMS microphones, are formed for example from a sequence of layers or layer structures, wherein the different layers can comprise in each case semiconductor materials, such as e.g. poly- or monocrystalline silicon, etc., or insulation materials, such as e.g. silicon nitride or silicon oxide, etc. The silicon oxide material is then used for example as material for sacrificial layers, wherein the sacrificial layer material is then removed from a defined exposure region at the end of the process for producing the MEMS component by means of an etchant in order to obtain the cleared exposure region or the cavity or else an air gap. Exposing the exposure region or the cavity is also referred to as a release process or a release etch. To that end, provision is made of one or a plurality or a multiplicity of access openings in the layer structure adjacent to the cavity to be formed, such that the applied etchant can penetrate into the exposure region from outside through the access openings of the layer structure and can remove the sacrificial material from the exposure region or from the cavity.

It is pointed out once again that the present concept is equally applicable to otherwise arbitrary configurations of the MEMS component comprising arbitrary sacrificial layer and semiconductor materials.

Some MEMS applications, then, necessitate hermetically sealing the access openings in the layer structure to the cavity, as may be the case for example for MEMS microphones, pressure sensors, etc. In this regard, by way of example, highly sensitive MEMS microphones have two movable membrane structures arranged in a manner separated from one another, wherein a relatively rigid counter-electrode structure (also called: backplate) is arranged between the membrane structures. The two membrane structures can thus form the cavity, which, in particular for highly sensitive microphones, can have an atmospheric reduced pressure or as far as possible a high vacuum, such that substantially no mechanical damping vis à vis the counter-electrode structure occurs upon the deflection of the membrane structures that are mechanically connected to one another.

In accordance with exemplary embodiments, then, reliable hermetic sealing of the access opening(s) of the layer structure to the cavity is achieved by means of a two-stage deposition process. In this regard, firstly a CVD deposition (CVD=Chemical Vapor Deposition) is carried out in order to form a first covering layer having a first layer thickness $D_{240}$ on the first layer structure and the access opening or the access openings. During the CVD deposition, by way of example, oxide material, such as e.g. a silicon oxide, or else a nitride material, such as e.g. a silicon nitride material, can be applied on the first layer structure, wherein at the access opening an overhang region of the applied material arises at the edge of the access opening if the layer thickness $D_{240}$ of the applied first covering layer is chosen to be in a range of between 0.3 and 1.0 times the inner minimum diameter or the "clear" diameter $D_{230}$ of the access opening and to be approximately 0.5 times the inner minimum diameter $D_{230}$ of the access opening. During the CVD layer deposition with the considered dimensioning ratio between the layer thickness $D_{240}$ of the first applied covering layer and the inner minimum diameter $D_{230}$ of the access opening, a CVD layer is thus obtained which has in a central region above the respective access opening an overhang at the edge of the access opening and thus a tapering of the applied CVD layer in a central region of the respective access opening, but which cannot yet provide a reliable hermetic seal or sealing of the access opening.

After the CVD application process for the first covering layer, then, an HDP layer deposition (HDP=High Density Plasma) is furthermore carried out, wherein said HDP layer deposition is subdivided into two HDP substeps in order to form a second covering layer on the first covering layer. The first substep of the HDP layer deposition involves implementing a liner material layer, e.g. comprising a nitride or oxide material, on the first covering layer, wherein the second substep involves partly backsputtering, i.e. removing material by means of sputtering, both the liner material layer and the first covering layer in the region above the through opening and in particular at the "tapering region" of the first covering layer at the access opening. The first and second substeps of the HDP layer deposition are then carried out alternately (or separately from one another) and repeatedly a number of times.

In accordance with exemplary embodiments, the specially "coordinated" HDP layer deposition process is carried out in two stages, i.e. with a first and second substep, wherein firstly a liner deposition is carried out, which is carried out substantially without backsputtering power (without bias). Consequently, it is possible to utilize the good edge coverage of the liner material during the HDP deposition process, while the second substep involves partly backsputtering both the applied liner material layer and the first covering layer (CVD layer) in the region above the through opening, since the backsputtering of the HDP process takes place in particular in the region of beveled edges, i.e. in the core region of the CVD layer at the access opening to be sealed. Consequently, the present HDP layer deposition involves carrying out backsputtering of the applied layer structures alternately with a liner material deposition.

By separating the HDP liner material application and the partial HDP material removal (=backsputtering) of the liner material layer and furthermore of the first covering layer primarily in the region above the through opening, it is possible to completely seal the core region of the tapering in the CVD layer at the access opening. The HDP process coordinated in accordance with exemplary embodiments thus has an application component and a material removal component, as a result of which it is possible to completely and hermetically seal the remaining tapering region in the CVD covering layer at the respective access opening.

In accordance with exemplary embodiments, when carrying out the HDP layer deposition, furthermore an initial step can be carried out before the first substep, wherein the initial step involves partly backsputtering the first covering layer in the region of the through opening. The process parameters of the HDP layer deposition can then be chosen so as to set the composition of the process gas used in the initial step such that the backsputtering is carried out with an at least reduced material application or else optionally without a material application.

The process sequence can thus also begin with a sputtering step (=initial step) on the previously deposited CVD layer. Afterward, the first and second substeps of the HDP layer deposition are then carried out alternately (or separately from one another) and for example repeatedly a number of times.

Optionally, a further covering or seal layer, e.g. composed of a silicon nitride material, can then be applied by means of a further CVD process in order also to provide a further hermetic seal layer at the top side of the layer stack present. Afterward, the resulting covering layer stack applied on the first layer structure and the access openings present therein can be structured, e.g. by means of a selective etching process, so as to obtain in each case an individual sealing element (also called sealing plug) at each access opening in the first layer structure to the cavity.

Since, in the HDP process, a high vacuum or a high atmospheric reduced pressure is present in the process region, furthermore a correspondingly high vacuum or a correspondingly high atmospheric reduced pressure is produced in the cavity during the hermetic sealing of the access opening(s) in the first layer structure and is also maintained after the hermetic sealing.

Furthermore, the procedure presented makes it possible for only an extremely small proportion of the layer materials supplied to deposit within the cavity during the CVD application process or the subsequent HDP application process, with the result that substantially no change in the functionality of the MEMS elements situated in the cavity, e.g. of the two membranes and/or of the counterelectrodes, is brought about. Furthermore, the functionality of the resulting MEMS component is not influenced by the separately arranged, small sealing elements (sealing plugs) obtained at the first layer structure in the region of the access opening(s). In this case, the number and position of the sealing elements depend on the preceding exposure or release process used to remove the sacrificial material from the region within the cavity.

In accordance with exemplary embodiments, what is thus made possible is that, when sealing the access openings to the cavity, this process is carried out under a high vacuum, such that a resulting high vacuum can be obtained in the cavity. Furthermore, the sealing elements can be formed in a manner governed by production such that they can be exposed to typical ambient conditions for microphones during use in mobile applications, without exhibiting a malfunction or a reduced performance. Furthermore, the hermetic sealing can be achieved reliably even vis à vis moisture. Furthermore, the mechanical and also electrical properties and functionalities of the resulting MEMS component, i.e. for example of a MEMS microphone or of a MEMS sensor, are not changed, or are only changed insignificantly, by the applied sealing elements.

Exemplary embodiments thus make it possible to seal an access opening through a layer structure to a cavity, i.e. an opening without a base, by carrying out the material application processes described, i.e. the sequence of CVD and HDP processes, such that a material application is carried out substantially only into the region of the sidewalls of the through openings or access openings to the cavity.

The access openings through the layer structure to the cavity and the sealing elements thereof can thus be arranged at any accessible surface region to the cavity.

The presented procedure for sealing a cavity, e.g. of a MEMS component or of a MEMS microphone, can be incorporated and integrated in the production process for MEMS components without high additional technical complexity.

Various exemplary embodiments will now be described more thoroughly with reference to the accompanying drawings, in which some exemplary embodiments are illustrated. In the figures, the thicknesses of lines, layers and/or regions may be illustrated in a manner not to scale, for clarification purposes.

Hereinafter, the basic sequence of the method steps of the method 100 for sealing a cavity, e.g. of a MEMS component (MEMS=microelectromechanical system), in accordance with one exemplary embodiment will now be explained with reference to schematic illustrations in FIGS. 1a-1d. In order to simplify the description of the geometric relationships, an x-y-z-coordinate system is illustrated by way of example in FIGS. 1a-1d, wherein the x-y-plane represents the plane of the drawing.

As is illustrated in FIG. 1a, in the method 100 for sealing a cavity, firstly a step 120 involves providing a layer arrangement 221 having a first layer structure 210 and a cavity 220 arranged adjacent to the first layer structure 210, wherein the first layer structure 210 has an access opening 230 to the cavity 220.

With regard to the illustration of the layer arrangement 221 in FIG. 1a, it is pointed out that only a small section of the layer arrangement 221 of, for example, a MEMS component (200—not shown completely) is illustrated, wherein the first layer structure 210 can be configured for example as a lamella or a movable membrane of a MEMS sensor element. In this regard, the first layer structure 210 can also have a plurality or multiplicity of access openings 230, wherein FIGS. 1a-1d illustrate merely in a detail view a single access opening 230 in the first layer structure 210, wherein the following description is however equally applicable to sealing a multiplicity of access openings 230 to the cavity 220.

Furthermore, it is pointed out that the following description of one exemplary embodiment of the method for sealing the cavity 220 is described by way of example on the basis of MEMS components, such as e.g. MEMS microphones or MEMS vacuum microphones, wherein the schematic illustrations illustrated in FIGS. 1a-1d may illustrate a partial section of a MEMS microphone. It should be taken into consideration, however, that the below-explained principle and method for sealing the access openings in a layer structure to a cavity are applicable to arbitrary MEMS components and are not restricted to the exemplary embodiments of MEMS microphones presented merely by way of example.

As is illustrated in FIG. 1a, the cavity 220 is delimited by the first layer structure 210 at one side, i.e. toward the top or in the y-direction, wherein the cavity 220 in the layer arrangement 221 is delimited or surrounded by further marginal elements (not shown in FIGS. 1a-1d) in the further directions, i.e. in the x- and z-directions. The first layer structure 210 can comprise for example a semiconductor material, such as e.g. a poly- or monocrystalline silicon material. The first layer structure 210 can have for example a layer thickness $D_{210}$ of 0.25 to 1 μm, for instance of 0.4 to 0.6 μm, and for example of approximately 0.5 μm. The access opening 230 in the first layer structure 210 has for example an inner minimum diameter or a "clear" diameter $D_{230}$ in a range of 0.2 to 1.5 μm, of 0.7 to 1.3 μm, and for instance of 1 μm.

Step 140 in FIG. 1b then involves carrying out a CVD layer deposition (CVD=Chemical Vapor Deposition) in order to form a first covering layer 240 having a layer thickness $D_{240}$ on the first layer structure 210 having the access opening 230. As is illustrated in FIG. 1*b*, in the region 230-A of the access opening 230 an "overhanging CVD layer material" of the first covering layer 240 forms at the edge region 230-B of the access opening 230. As a result, the first covering layer 240 forms in a tapered shape (in the y-direction) as far as the central region or core region of the access opening 230. The tapering or core 240-A of the layer material 240 can also be configured as approximately double-conical. By means of the first covering layer 240 obtained by means of CVD layer deposition, a reliable hermetic sealing of the access opening 230 cannot yet be achieved in the overhang region 230-A with the (double-conical) tapering in the core region 240-A.

In order to hermetically seal said core region 240-A in the first covering layer 240 above the access opening 230 or within the opening region 230-A, a step 160, as illustrated schematically in FIG. 1*c*, then involves carrying out an HDP layer deposition (HDP=High Density Plasma), which is also referred to as HDP-CVD layer deposition, for forming a second covering layer 250 above or on the first covering layer 240. In this case, the HDP layer deposition step 160 is divided into a first and second substep. The first substep involves firstly depositing a liner material layer 250 on the first covering layer 240. The second substep involves partly backsputtering the liner material layer 250 and also the first covering layer 240 at least in the region 230-A above or at the through opening 230. The first and second substeps are then carried out alternately and repeatedly a number of times in order ultimately to form the second covering layer 250 on the first covering layer 240.

In accordance with exemplary embodiments, the specially coordinated HDP layer deposition process is carried out in two stages, i.e. with a first and second substep, wherein firstly a liner deposition (also called: liner material deposition) is carried out, which is carried out substantially without backsputtering power (without bias). Consequently, it is possible to utilize the good edge coverage of the liner material during the HDP deposition process, while the second substep involves partly backsputtering both the applied liner material layer and the first covering layer (CVD layer) 240 in the region above the through opening 230, since the backsputtering of the HDP process takes place in particular in the region of beveled edges, i.e. in the core region of the CVD layer at the access opening 230 to be sealed. Consequently, the present HDP layer deposition involves conducting or carrying out backsputtering of the applied layer structures alternately with a liner material deposition.

By separating the HDP liner material application and the partial HDP material removal of the liner material layer and furthermore of the first covering layer 240 primarily in the region 230-A of the through opening 230, it is possible to completely seal the core region 240-A of the tapering in the CVD layer 240 above the access opening. Furthermore, a relatively deep sealing of the access opening 230 is achieved at the edge region 230-B since the sealing material comprising the CVD layer 240 and the HDP layer 250 is introduced into the access opening 230 substantially as far as the lower edge (adjacent to the cavity).

The HDP process coordinated in accordance with exemplary embodiments thus has an application component and a material removal component, as a result of which it is possible to completely and hermetically seal the remaining tapering region in the CVD covering layer 240 above the respective access opening 230.

In accordance with exemplary embodiments, when carrying out the HDP layer deposition, furthermore an initial step can be carried out before the first substep, wherein the initial step involves partly backsputtering the first covering layer 240 in the region of the through opening 230. The process parameters of the HDP layer deposition can then be chosen so as to set the composition of the process gas used in the initial step such that the backsputtering is carried out with an at least reduced material application or else optionally without a material application.

The process sequence can thus also begin with a sputtering step (=initial step) on the previously deposited CVD layer 240. Afterward, the first and second substeps of the HDP layer deposition are then carried out alternately (or separately from one another) and for example repeatedly a number of times in order to obtain the HDP layer 250.

Optionally, a further covering or seal layer 270, e.g. composed of a silicon nitride material, can then be applied by means of a further CVD process in order also to provide a further hermetic seal layer at the top side of the layer stack 260 present. Afterward, the resulting covering layer stack 261 applied on the first layer structure 210 and the access openings 230 present therein can be structured, e.g. by means of a selective etching process, so as to obtain in each case an individual sealing element 280 (also called sealing plug) at each access opening 230 in the first layer structure 210 to the cavity 220.

Since, in the HDP process, a high vacuum or a high atmospheric reduced pressure is present in the process region, furthermore a correspondingly high vacuum or a correspondingly high atmospheric reduced pressure is produced in the cavity 220 during the hermetic sealing of the access opening(s) 230 in the first layer structure 210 and is also maintained after the hermetic sealing.

The first covering layer 240 obtained by means of a CVD layer deposition in step 140 and the second covering layer 250 obtained thereon by means of an HDP layer deposition in step 160 then form the layer sequence 260 that hermetically seals the at least one access opening 230 in the first layer structure 210 to the cavity 220.

After step 160 of the HDP layer deposition, an upper covering or sealing layer 270 can furthermore also be applied on the layer sequence 260, wherein the additional (optional) upper covering layer 270 can comprise an insulation material, such as e.g. SiN (silicon nitride), SiC (silicon carbide) or else some other insulation material. As is then illustrated in optional step 180 in FIG. 1*d*, the resulting layer stack 261 can be structured in order to form a local sealing element 280 (sealing plug) at the through opening 230 or in each case a local sealing element 280 at the plurality of through openings 230.

The upper covering layer 270 can be applied on the layer sequence 260, for example, in order to form the layer stack 261, wherein the layer stack 261 can be structured, i.e. subjected to an etching-back step with or without a mask, in order to form the sealing element 280 or the sealing elements 280.

In accordance with a further exemplary embodiment, the layer sequence 260 comprising the first and second covering layers 240, 250 can also be structured, wherein the additional sealing or covering layer 270 can then be applied and be subjected to an etching-back step with or without a mask in order to obtain the final seal of the sealing element 280. If the upper sealing layer 270 is applied on the structured layer sequence 260, it is also possible for this additional, upper covering layer 270 to extend onto the sidewall region of the structured layer sequence 260 and optionally also further onto an adjacent section of the upper surface of the first layer structure 210 (not shown in FIG. 1d).

Step 160 of carrying out the HDP layer deposition involves hermetically sealing the access opening 230 through the first layer structure 210 to the cavity 220 at an atmospheric reduced pressure, i.e. the HDP process pressure, such that the cavity 220 having said atmospheric reduced pressure is obtained. During an HDP process, the atmospheric reduced pressure can be in a range of, for example, 2 to 10 mtorr or be approximately 5 mtorr, i.e. in a range that can be referred to as vacuum or else high vacuum. In accordance with one exemplary embodiment, the pressure or reduced pressure (atmospheric reduced pressure) in the sealed cavity 220 can be substantially a vacuum or a virtual vacuum (high vacuum). Alternatively, the pressure in the hermetically sealed cavity 220 can be less than 1%, 0.1%, 0.01% or 0.001% of the atmospheric ambient pressure or of the atmospheric standard pressure (also physical atmosphere), wherein the atmospheric standard pressure (physical atmosphere) can typically be 101.325 kPa or 1013.25 mbar or 760 torr. The pressure in the hermetically sealed cavity 220 can also be an absolute pressure, e.g. with an absolute pressure of less than 100 mtorr, 50 mtorr or less than 10 mtorr. The pressure unit "physical atmosphere" is oriented to the magnitude of normal air pressure at sea level.

The process parameters when carrying out step 160 of the HDP layer deposition can then be set such that in the first substep, i.e. the deposition of a liner material layer on the first covering layer, an at least reduced sputtering power is set or obtained in order to carry out the liner material layer deposition, and wherein in the second substep the composition of the process gas used is set in order to carry out the backsputtering with an at least reduced material application. In accordance with a further exemplary embodiment, the process parameters when carrying out the HDP layer deposition can be set such that the first substep of the HDP layer deposition is carried out without an (effective) sputtering power, and that the second substep of the HDP layer deposition is carried out without an (effective) material application.

In this context, reference is made to FIG. 2, which illustrates one exemplary HDP process system with reference to specific process parameters for carrying out the method of HDP layer deposition (in accordance with step 160) in accordance with one exemplary embodiment.

As is illustrated in FIG. 2, the exemplary HDP-CVD reactor 300 in FIG. 2 comprises the following basic elements: a tunable induction coil 302, a temperature-controlled ceramic dome 304, a gas port 306 a remote plasma applicator 308, a turbo pump 310, a throttle and shut-off valve arrangement 312, an electrostatic chuck (clamping chuck or rotary chuck) 314, a chamber body 316, adjustable gas injection elements 318, and a heating/cooling plate 320, which are arranged in the manner as illustrated schematically in FIG. 2. In accordance with exemplary embodiments, the HDP process parameters are then set such that the two substeps for producing the second covering layer by means of an HDP process are carried out substantially separately or successively and repeatedly in order to seal in particular the core region 240-a of the applied CVD covering layer 240 hermetically with the second covering layer 250.

In accordance with one exemplary embodiment, it is possible firstly to carry out the filling or sealing of the access opening 230 in the first layer structure 210 even without a "base" in the opening 230, with no or only extremely little deposition of material within the cavity 220, by means of the access opening 230 firstly being sealed "for the most part" by an insulation material being applied by means of a typical CVD process, wherein the applied material of the first covering layer 240 produces an overhang or overhang region at the edge 230-B of the access opening 230.

This is followed by an HDP layer deposition process having an application component and a sputtering component, using the HDP-CVD reactor 300 illustrated by way of example in FIG. 2. This HDP process is then set so as to close the "heart", i.e. the double-conical core 240-A, of the applied covering layer 240 in the center region of the access opening 230. This is done by implementing the HDP process with two successive "separate" substeps, wherein the first substep involves depositing a liner material layer on the first covering layer with an at least reduced and for example with no sputtering power, while the second substep involves partly backsputtering the liner material layer and furthermore the first covering layer 240 in the region above the through opening 230 with an at least reduced liner material application and for example with no liner material application. These two substeps are then carried out alternately and repeatedly a number of times in order to obtain a hermetic sealing of the access opening 230 by means of the two applied layers 240 (CVD layer) and 250 (HDP layer). Since the HDP process is carried out at a high vacuum, a reduced pressure (high vacuum or virtual vacuum) can be obtained in the cavity 220 since this is the process pressure. A final covering or sealing layer can be implemented from the top side for example directly after the HDP process or else later after the structuring of the layer stack 260 comprising the two layers 240 and 250.

The reduction or complete omission of the sputtering power can be achieved for example by virtue of the bias power, i.e. the RF biasing power source applied to the wafer holding electrode (electrostatic chuck), experiencing no supply power, that is to say that the sputtering etching component is substantially "switched off" during the material application (liner material deposition) (first substep). In the second substep, substantially exclusively backsputtering of the layer stack with the material application being at least reduced or switched off can be obtained by virtue of the composition of the reaction or process gases for example being changed such that no liner material deposition takes place (substep 2).

The process parameters for example in the first substep of the HDP layer deposition (liner material deposition) can be set to a power at the top electrode or anode (top) with 1300 watts and at the side electrodes (side=adaptation power) with 2700 watts, while the power in the second substep (in the sputtering or backsputtering process) can be set to 1200 watts at the top electrode (top), to 4000 watts at the side electrode (side), and the bias power (cathode) can be set to 3000 watts. These values should be regarded as purely by way of example.

Some geometric relationships between the dimensions of the first layer structure 210, the access opening(s) 230 arranged therein and the layers 240 (CVD layer) and 250 (HDP layer) applied on the first layer structure 210 having the access opening 230, or the layer thicknesses of said layers, will now be discussed by way of example hereinafter.

In this regard, the access opening 230 in the first layer structure 210 has for example an inner minimum diameter or a clear diameter $D_{230}$ in a range of 0.2 to 1.5 μm. The inner minimum diameter can also be regarded as the "clear dimension" at the geometric centroid of the access opening 230. The diameter (inner minimum diameter) $D_{230}$ of the access opening 230 can thus be in a range of 0.2 μm to 1.5 μm. The layer thickness $D_{210}$ of the first layer structure 210, i.e. for example the edge length 230-B thereof, can be in a range of 0.25 to 1 µm and be approximately 0.5 µm. The layer thickness $D_{240}$ of the applied first covering layer 240 can be (e.g. in a region outside the access opening 230-A) in a range of 0.06 to 1.5 µm, of 0.4 to 0.7 µm, and be approximately 0.5 µm. Carrying out the CVD deposition 140 can then be set such that the first covering layer 240 has a layer thickness $D_{240}$ in order to obtain a dimension ratio $D_{240}/D_{230}$ between the layer thickness $D_{240}$ of the first applied covering layer 240 and the diameter $D_{230}$ of the access opening 230 that is in a range of 0.3 and 1 and is approximately 0.5, i.e. 0.3 $D_{230} \leq D_{240} \leq 1.0$ $D_{230}$ or $D_{240} \approx 0.5 \cdot D_{230}$. The layer thickness $D_{250}$ of the applied HDP layer 240 can be e.g. in a range of 0.05 to 1 µm, of 0.1 to 0.8 µm, and be approximately 0.5 µm.

With regard to the access opening 230 in the first layer structure 210, it is pointed out that the inner contour of the access opening in a plan view or in the x-z-plane can be configured as an arbitrary polygon or e.g. as a regular convex polygon. The inner contour of the access opening 230 can be configured for example as rectangular or circular. The access opening 230 or the inner contour thereof can then be configured geometrically, for example, such that a minimum distance $\Delta x$ between an arbitrary point within the access opening in and parallel to the x-z-plane of the surface of the access opening 230 and the closest marginal point 230-B of the access opening 230 is less than or equal to half the diameter (inner minimum diameter) $D_{230}$ of the access opening 230, i.e. $\Delta x \leq D_{230}/2$.

In accordance with one exemplary embodiment, a further covering layer 270, e.g. composed of an insulation material, such as SiN (silicon nitride), SiC (silicon carbide), etc., can be formed on the HDP layer 250 in order to form a covering layer stack 261 or the local sealing element 280 (sealing plug). Applying the further (optional) covering layer 270 can be carried out for example before or else after structuring the layer sequence 260 comprising the CVD layer 240 and the HDP layer 250. The layer thickness $D_{270}$ of the further covering layer 270 can be e.g. in a range of 0.1 to 0.5 µm and be approximately 0.3 µm.

With regard to the production process 100 in FIGS. 1a-1d, it is pointed out that the first layer structure 210 can also have a plurality of access openings 230 to the cavity 220, that is to say that the first layer structure 210 can be extended (considerably) further in the x-z-plane in order to form for example a first membrane of a MEMS microphone. In accordance with one exemplary embodiment, when carrying out the CVD layer deposition 140 and the HDP layer deposition 160, it is thus possible to hermetically seal the plurality of access openings 230 through the first layer structure 210 to the cavity 220, wherein the vacuum or high vacuum can furthermore be configured in a manner corresponding to the process pressure during the HDP deposition process 160 in the cavity 220.

In accordance with one exemplary embodiment, the layer arrangement 221 can also have a second layer structure 224 (cf. FIG. 4), which is spaced apart from the first layer structure 210, wherein the cavity 220 is arranged at least in sections between the first and second layer structures 210, 224, wherein the second layer structure 224 furthermore has at least one access opening 231 to the cavity 220. When carrying out the CVD deposition 140, a first covering layer 240 having the layer thickness $D_{240}$ can furthermore be formed on the second layer structure 224 having the at least one access opening 231, wherein, when carrying out 160 the HDP layer deposition, a second continuous covering layer 250 can be formed on the first covering layer 240 of the second layer structure 224.

In accordance with one exemplary embodiment, the second layer structure 224 can have a plurality of further access openings 231 to the cavity 220, wherein, when carrying out 160 the HDP layer deposition, it is possible to hermetically seal the plurality of further access openings 231 through the second layer structure 224 to the cavity 220 and it is possible to form the atmospheric reduced pressure in the cavity 220.

In accordance with one exemplary embodiment, the layer arrangement 221 can be part of a MEMS component 200 comprising a MEMS layer system 221 on a carrier substrate 222 with a double-membrane arrangement 210, 224 and a counterelectrode structure 228 situated therebetween. In accordance with one exemplary embodiment, the MEMS component 200 can be configured as a vacuum microphone.

Hereinafter, with reference to FIGS. 3a-3e, a description will now be given of exemplary detail illustrations, such as e.g. SEM images (SEM=Scanning Electron Microscope) or FIB images (FIB=Focus Ion Beam), of the access openings 230 to be sealed and of the sealing element 280 obtained during different sections of the production method wo from FIGS. 1a-1d in accordance with one exemplary embodiment. In order to simplify the description of the geometric relationships, once again an x-y-z-coordinate system is illustrated by way of example in FIGS. 3a-3e, wherein the x-z-plane is oriented parallel to the main surface region of the first layer structure 210, while the y-direction extends in the thickness direction of the first layer structure 210, i.e. perpendicularly to the x-z-plane, and thus reproduces the topography perpendicular to the x-z-plane.

Figure 3A:
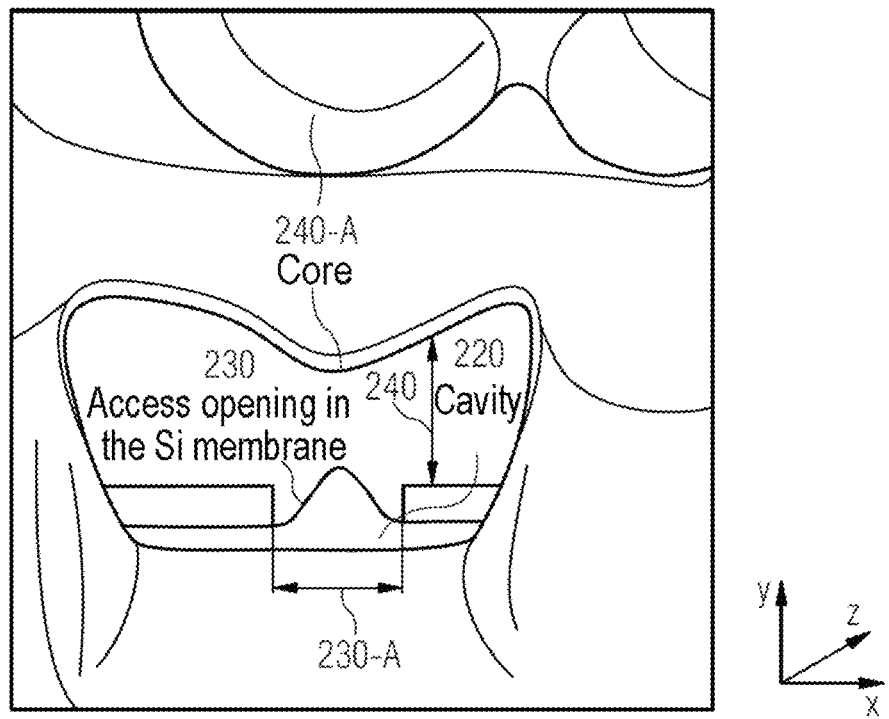
FIGS. 3a-3e show detail illustrations of the access openings to be sealed and of the sealing elements obtained during different process sections of the production method for sealing a cavity in accordance with one exemplary embodiment.

FIG. 3a, then, shows a partial cross-sectional view corresponding to method step 140 from FIG. 1b, after the application of the first covering layer 240 (CVD layer) on the first layer structure 210 having the access opening 230. FIG. 3a furthermore clearly reveals the "core" 240-A in the form of the tapered region of the applied CVD layer 240 in the center region 230-A within the through opening 230 in the first layer structure 210. Furthermore, after the CVD layer deposition 140 the overhanging section of the first covering layer 240 over the edge region 230-B of the first layer structure 210 with the resulting "core region" 240-A is evident, which does not yet allow a hermetic sealing of the cavity 220.

Figure 3B:
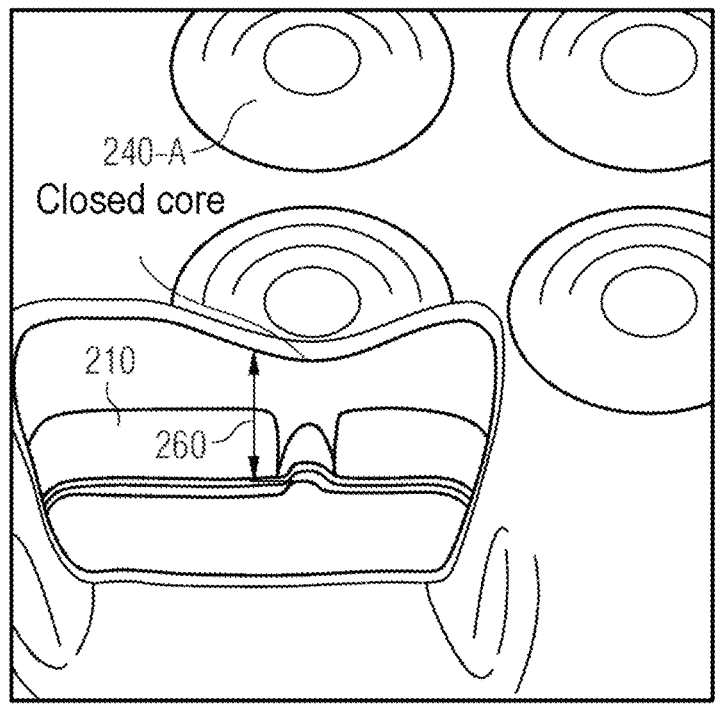

FIG. 3b then illustrates a detail view of the sealed access opening 230 after carrying out the HDP layer deposition in step 160 from FIG. 1c. As is evident from FIG. 3b, the core regions 240-A of the applied first covering layer (CVD layer) 240 are hermetically sealed by the second covering layer 250 (HDP layer) and the optional further upper covering layer 270 (not shown in FIG. 3b).

Figure 3C:
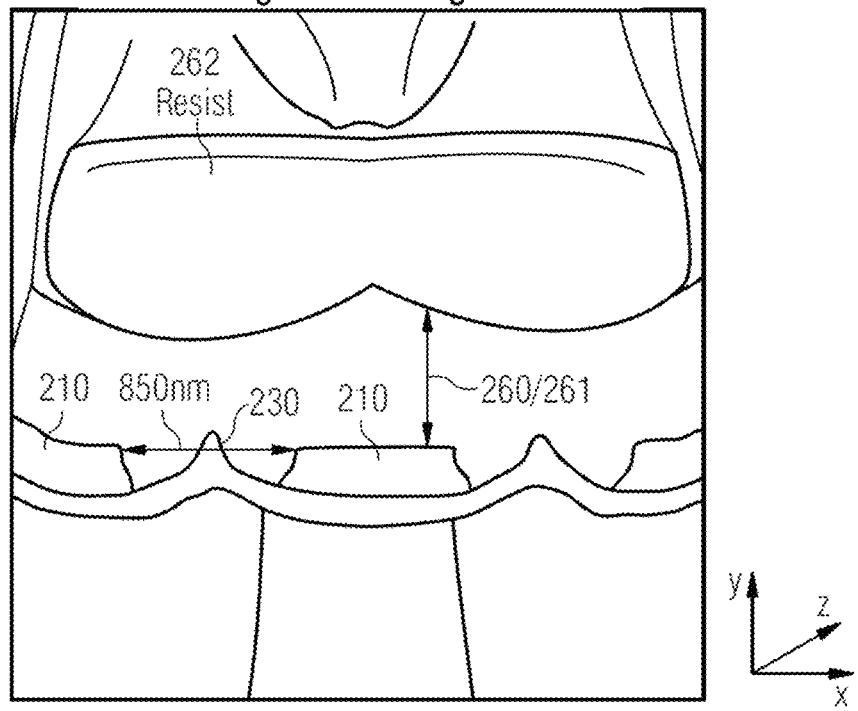

As is illustrated in FIG. 3c, a so-called "photoresist" 262 or a mask can then be applied on those regions of the layer stack 261 at which the individual local sealing elements 280 are intended to be formed. In the illustration in FIG. 3c, the access opening 230 has an exemplary diameter $D_{230}$ of 850 nm.

Figure 1D:
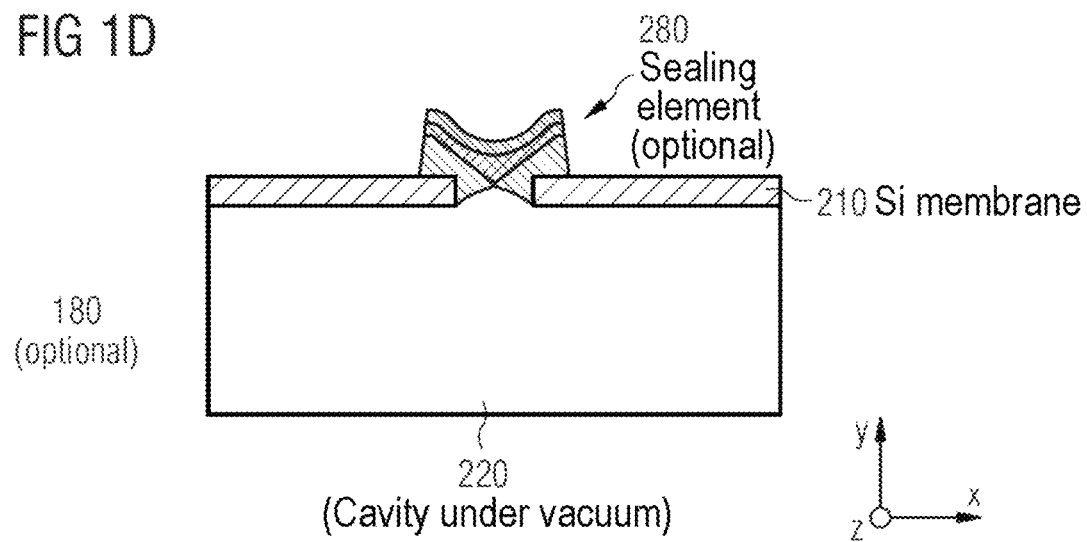
Figure 3D:
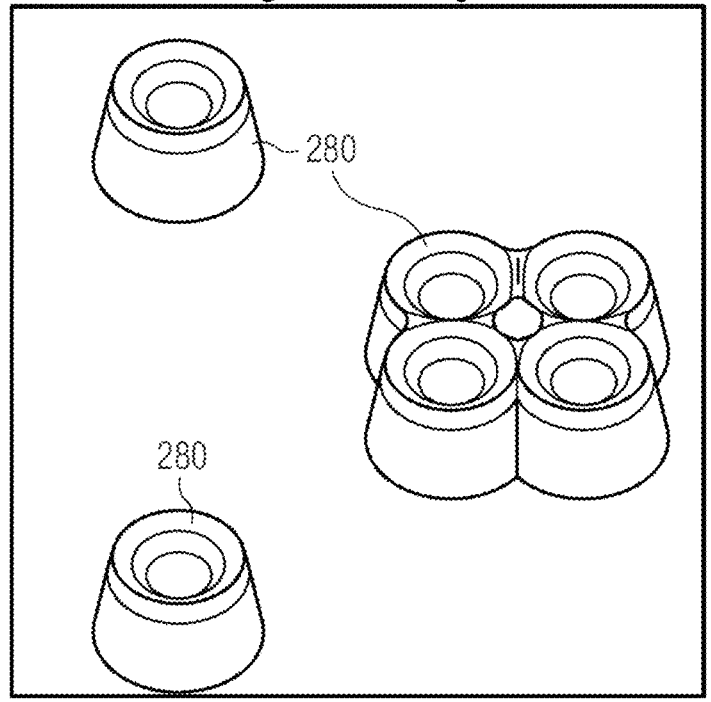
Figure 3E:
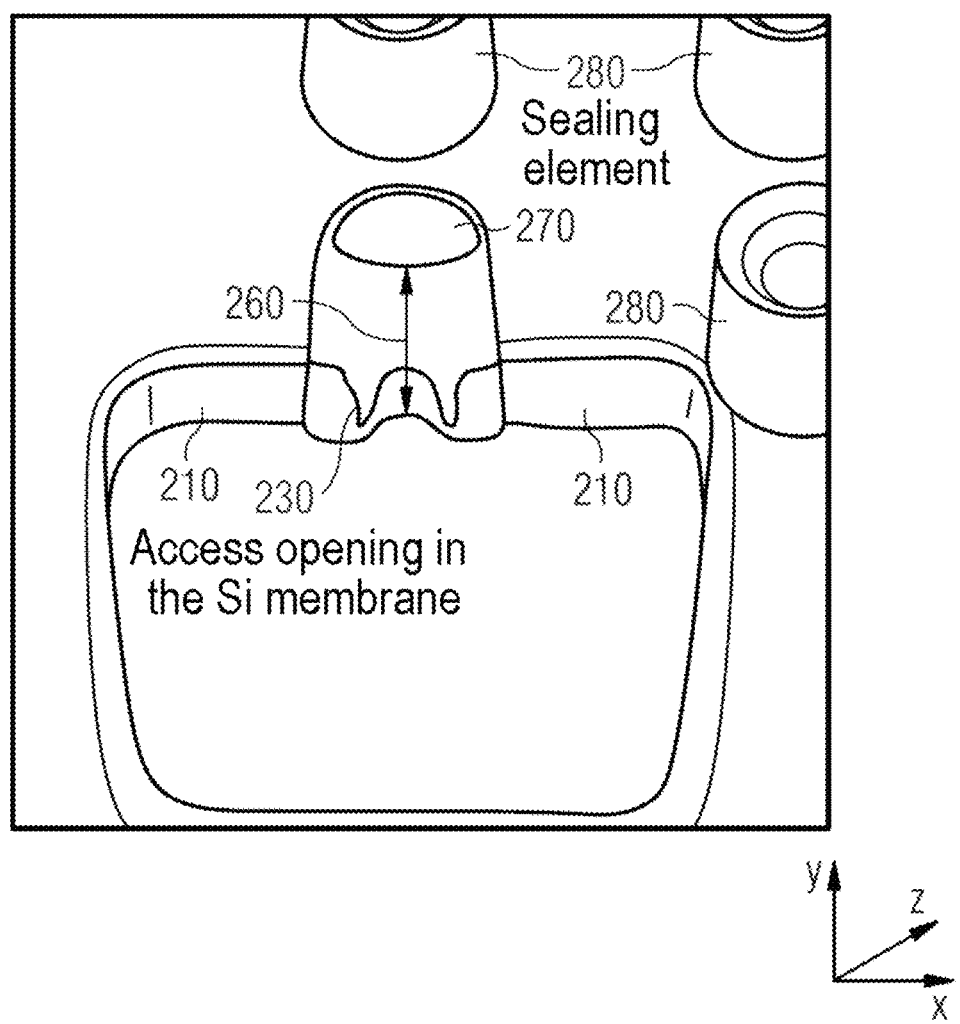

FIG. 3d then illustrates the sealing elements 280 (sealing plugs) obtained after the structuring step 180 from FIG. 1d, wherein that part of the layer stack 261 which is situated outside the mask material was removed and the local sealing elements 280 for hermetically sealing the cavity 220 remain.

FIG. 3e shows once again a partial cross-sectional view through a single sealing element 280, corresponding to the illustration from FIG. 1d, wherein layer sections comprising the CVD layer section 240, the HDP layer section 250 and the upper covering layer section 270 are evident.

A basic illustration of a MEMS component 200 in the form of a double-membrane MEMS component, also referred to as a double-membrane microphone or vacuum microphone, will now be explained below with reference to FIG. 4.

In accordance with one exemplary embodiment, the MEMS component 200 (also referring to FIG. 1d) comprises a layer arrangement 221 having a first layer structure 210 and a cavity 220 arranged adjacent to the first layer structure 210, wherein the first layer structure 210 has at least one access opening 230 to the cavity 220, and furthermore a structured covering layer stack 261 for forming a local sealing element 280 at the through opening 230, wherein the local sealing element 280 has a layer sequence 260 comprising a CVD layer 240 and an HDP layer 250. The MEMS component 200 can be configured as a vacuum microphone and comprise a MEMS layer system 221 on a carrier substrate 222 with a double-membrane arrangement 210, 224 and a counterelectrode structure 228 situated therebetween.

As is illustrated in FIG. 4, the double-membrane MEMS component 200 comprises a layer arrangement 221 on a carrier substrate 222, wherein the layer arrangement 221 comprises a first and second membrane structure 210, 224 spaced apart from one another, and a counterelectrode structure 228 arranged therebetween, which is spaced apart in each case from the first and second membrane structures 210, 224, and at least one mechanical connection element 241 between the first and second membrane structures 210, 224, which is mechanically coupled between the first and second membrane structures 210, 224 and is mechanically decoupled from the counterelectrode structure 228.

As is illustrated in FIG. 4, the sacrificial material 226 is maintained in the edge region 221-A, 221-B of the layer arrangement 221 and is effective for example as a mechanical bearing or support structure for the first and second membrane structures 210, 224 and the counterelectrode structure 228 on the substrate 222. Furthermore, the substrate 222 can have a cavity 220 for exposing the movable section of the double-membrane structure 210, 224. As is illustrated in FIG. 4, by way of example, the first and second membrane structures 210, 224 can have an optional segmentation 232. Furthermore, a so-called "ventilation or equalization opening" 234 can be provided in the double-membrane structure 210, 224 of the MEMS component 200.

The present concept is thus applicable to acoustic MEMS sensors, such as e.g. MEMS microphones, wherein, by way of example, a sequence of layers comprising materials, such as e.g. poly/mono-silicon, silicon nitride and silicon oxide, is used in MEMS microphones. The silicon oxide material is usually used as a sacrificial layer and is etched out from a defined region of the MEMS microphone at the end of the production process. For so-called "hermetically sealed double membrane microphones", by way of example, two movable membrane structures 210, 224 are used, wherein an atmospheric reduced pressure is present in the interspace or the cavity 220 between the two membranes 210, 224. In order to avoid a collapse or curving inward of the membrane structures, the mechanical connection elements 241, which are also referred to as columns, are used to maintain a fixed interspace between the two membrane structures 210, 224.

As becomes clear from the illustration in FIG. 4, the layer arrangement 221 furthermore comprises a second layer structure 224, which is configured for example as a second membrane of the MEMS microphone. The second layer structure is thus arranged in a manner spaced apart from the first layer structure 210, wherein the cavity 220 is arranged (at least in sections) between the first and second layer structures, and wherein the second layer structure has at least one access opening or a plurality of access openings 231 to the cavity 220. In step 140 of carrying out the CVD deposition, furthermore, a first covering layer 210 having the layer thickness $D_{210}$ can be formed on the second layer structure having the at least one access opening 231, and wherein, in step 160 of carrying out the HDP layer deposition, a second continuous covering layer can be formed on the first covering layer of the second layer structure in order to hermetically seal the access opening or access openings 231 to the cavity 220 that is or are arranged in the second layer structure 224.

Therefore, the above explanations referring to FIGS. 1a-1b, FIG. 2 and FIGS. 3a-3e are equally applicable to the hermetic sealing of further access openings in the second layer structure to the cavity 220.

Exemplary embodiments of the present concept are explained once again in different words hereinafter.

The present concept for sealing an access opening to a cavity is applicable to MEMS microphones, for example, wherein highly sensitive MEMS microphones, i.e. MEMS microphones having a high signal-to-noise ratio (SNR), have a "vacuum cavity", i.e. a cavity having a high atmospheric reduced pressure. MEMS microphones that are also referred to as vacuum microphones or double-membrane microphones comprise two mechanically coupled semiconductor membranes, e.g. silicon membranes, arranged parallel, wherein a single counterelectrode (backplate) is arranged e.g. centrally between the two membranes. A sacrificial material layer that makes it possible to construct the MEMS structure by means of a plurality of application and etching steps is removed at the end of the process for producing the MEMS microphone through small access openings, i.e. exposure openings or release openings, e.g. in the upper membrane or else in both membranes, wherein a relatively large cavity is obtained between the membrane structures and the mechanical anchoring thereof at the edge region of the layer structure of the MEMS sensor.

In order to obtain a vacuum microphone (double-membrane microphone), for example, it is necessary to evacuate and hermetically seal or close the cavity to the greatest possible extent, in order to avoid any superfluous damping of the moving membrane structures during sound detection. However, the sealing or closure process should not have any adverse effects on the properties and functionality of the MEMS microphone, in particular the functionality or robustness of the membrane structures.

MEMS cavities are usually sealed under atmospheric pressure or relatively low reduced pressure. Materials used for sealing the cavities vary on the basis of the application process, e.g. silicon oxide (TEOS, BPSG, SiOx, . . . ), silicon nitride (LPCVD, CVD), aluminum, tungsten (PVD, CVD, growth epitaxy), or use polymer material or films, depending on the requirements made in respect of the functionality, reliability, environmental influences and process complexity. However, none of the processes mentioned can offer a hermetic sealing of through openings in a thin semiconductor membrane (e.g. silicon membrane) above a large cavity, without impairing the properties or functionality of the resulting MEMS sensor.

In accordance with exemplary embodiments, a MEMS microphone comprising two movable membrane structures, between which a relatively rigid counterelectrode is arranged in a cavity, will be able to carry out sound detection virtually without damping if the interspace or the cavity between the membrane and the counterelectrode is situated in a cavity under a high vacuum. In order to produce the cavity, a sacrificial layer is typically applied in order to produce the structure of the MEMS component, wherein said sacrificial layer is removed or etched by means of a wet etching or vapor etching process generally through small holes, such as e.g. access openings, in the envelope of the cavity. In this case, it is all the more advantageous, the further the number, size and at least the width in a dimension of the openings at the surface of the cavity can be reduced or minimized. For thin membrane elements, by way of example, an aspect ratio of approximately 0.5 between the width or the diameter of the through openings of up to 1 µm and the depth of the through opening, i.e. the thickness of the membrane layer, of approximately 0.5 µm is present. If the membrane is then evacuated, i.e. a vacuum is produced as much as possible, and said vacuum is maintained as much as possible by hermetically sealing the cavity, any damping of the moving membrane elements during sound detection can be avoided.

In accordance with exemplary embodiments, the sealing or closure process can be carried out without impairing the properties of the MEMS microphone, in particular the functionality or robustness of the membrane elements, wherein the resulting MEMS microphone can furthermore be subjected to typical ambient conditions for microphones during use in mobile applications.

In accordance with one exemplary embodiment, a sealing process is then carried out under a high vacuum with a reliable sealing material, wherein furthermore this process of filling the access openings to the cavity, which have no "base", is carried out such that substantially no or only an insignificant amount of the sealing material is applied within the cavity. In accordance with exemplary embodiments, the method for sealing an access opening to a cavity involves firstly sealing the access opening to the greatest possible extent by applying a material by means of a CVD deposition process, by producing a material overhang at the edge of the access opening with the applied CVD layer material, which is followed by an HDP layer deposition process, which is in turn subdivided into two substeps, comprising a deposition component (first substep) and a sputtering component (second substep).

Firstly, the first substep involves carrying out a liner deposition, which is carried out substantially without backsputtering power (without bias), wherein the good edge coverage of the liner material is utilized during the HDP deposition process. The second substep involves partly backsputtering both the applied liner material layer and the first covering layer (CVD layer) in the region above the through opening without a liner material application, since the backsputtering in the HDP process is effective in particular in the region of beveled edges, i.e. in the core region of the CVD layer above the access opening to be sealed.

This process is then coordinated to the effect of closing the core or the "heart" in the center of the opening of the previously applied CVD layer. Since the HDP process is a high-vacuum process, a very low pressure is ensured in the cavity since this is the process pressure. An (optional) final sealing layer can be implemented from the top side for example directly after the HDP deposition process or else later after the structuring of the applied CVD and HDP layers, i.e. of the sealing layer stack or of the sealing layer.

In accordance with exemplary embodiments, the access openings (holes) to the cavity are sealed under a high vacuum during the HDP process, thus resulting in the correspondingly high vacuum in the cavity. Furthermore, an extremely small proportion of the applied material is applied within the cavity during the CVD and HDP deposition, with the result that any change in the functionality of the membranes or counterelectrode of the MEMS microphone can be prevented or avoided. Furthermore, the separately arranged, small sealing elements at the respective layer structure, e.g. at the upper and/or lower membrane, do not impair the functionality of the resulting sensor, i.e. of the MEMS microphone (vacuum microphone). The respective position and the number of the sealing elements (sealing plugs) thus depend on the process used to remove the sacrificial material from the region within the cavity.

In accordance with exemplary embodiments, therefore, a robust, reliable and cost-effective solution is obtained for closing and hermetically sealing an opening or an access opening having small sidewalls and no underside (base) under vacuum without a significant proportion of the application material depositing within the cavity. This is carried out in accordance with exemplary embodiments by means of a combination of a CVD deposition process and the "modified" HDP deposition process with the two separate substeps for liner material deposition and for backsputtering.

Exemplary embodiments for sealing an access opening to a cavity are applicable for example to MEMS microphones, but also to any other MEMS elements or MEMS sensors that require a hermetically sealed vacuum cavity.

Additional exemplary embodiments and aspects of the invention are described, which can be used individually or in combination with the features and functionalities described herein.

In accordance with a first aspect, a method wo for sealing an access opening 230 to a cavity 220 can comprise the following steps: providing 120 a layer arrangement 221 having a first layer structure 210 and a cavity 220 arranged adjacent to the first layer structure 210, wherein the first layer structure 210 has an access opening 230 to the cavity 220, carrying out 140 a CVD layer deposition for forming a first covering layer 240 having a layer thickness $D_{240}$ on the first layer structure 210 having the access opening 230, and carrying out 160 an HDP layer deposition with a first and second substep for forming a second covering layer 250 on the first covering layer 240, wherein the first substep involves depositing a liner material layer 250 on the first covering layer 240, wherein the second substep involves partly backsputtering the liner material layer 250 and furthermore the first covering layer 240 in the region 230-A of the access opening 230, and wherein the first and second substeps are carried out alternately and repeatedly a number of times.

In accordance with a second aspect referring to the first aspect, in the method 100, when carrying out 160 the HDP layer deposition, the access opening 230 through the first layer structure 210 to the cavity 220 can be hermetically sealed at an atmospheric reduced pressure and a cavity 220 having an atmospheric reduced pressure can be obtained.

In accordance with a third aspect referring to the first aspect, in the method 100, the process parameters of the HDP layer deposition can be set such that in the first substep and at least reduced sputtering power is set in order to carry out the liner material layer deposition, and in the second substep the composition of the process gas used is set in order to carry out the backsputtering with an at least reduced material application.

In accordance with a fourth aspect referring to the third aspect, in the method 100, the process parameters of the HDP layer deposition can be set such that the first substep is carried out without sputtering power, and the second substep is carried out without material application.

In accordance with a fifth aspect referring to the first aspect, in the method 100, the access opening 230 can have a diameter $D_{230}$, and the layer thickness $D_{240}$ of the applied first covering layer 240 can be chosen in order to obtain a size ratio $D_{240}/D_{230}$ between the layer thickness $D_{240}$ of the first covering layer 240 and the inner minimum diameter $D_{230}$ of the access opening which is in the range of between 0.3 and 1.0, and is approximately 0.5.

In accordance with a sixth aspect referring to the first aspect, in the method 100, the access opening 230 can be configured as a regular convex polygon.

In accordance with a seventh aspect referring to the first aspect, the method 100 can furthermore comprise the following step: applying a further seal layer 270 on the second covering layer 250 in order to form a covering layer stack 261.

In accordance with an eighth aspect referring to the seventh aspect, the method 100 can furthermore comprise the following step: structuring the covering layer stack 261, in order to form a local sealing element 280 at the access opening 230.

In accordance with a ninth aspect referring to the first aspect, in the method 100, the first layer structure 210 can have a plurality of access openings 230 to the cavity 220, wherein, when carrying out 160 the HDP layer deposition, the plurality of access openings 230 through the first layer structure 210 to the cavity 220 are hermetically sealed and the atmospheric reduced pressure is formed in the cavity 220.

In accordance with a tenth aspect referring to the first aspect, in the method 100, the layer arrangement 221 can have a second layer structure 224, which is spaced apart from the first layer structure 210, and the cavity 220 can be arranged at least in sections between the first and second layer structures 210, 224, wherein the second layer structure 224 furthermore has at least one access opening 231 to the cavity 220, wherein, when carrying out the CVD layer deposition 140, furthermore a first covering layer 240 having the layer thickness $D_{240}$ is formed on the second layer structure 224 having the at least one access opening 231, and wherein, when carrying out 160 the HDP layer deposition, a second continuous covering layer 250 is formed on the first covering layer 240 of the second layer structure 224.

In accordance with an eleventh aspect referring to the tenth aspect, in the method 100, the second layer structure 224 can have a plurality of further access openings 231 to the cavity 220, wherein, when carrying out 160 the HDP layer deposition, the plurality of further access openings 231 through the second layer structure 224 to the cavity 220 are hermetically sealed and the atmospheric reduced pressure is formed in the cavity 220.

In accordance with a twelfth aspect referring to the first aspect, in the method 100, the layer arrangement 221 can be part of a MEMS component 200 having a MEMS layer system 221 on a carrier substrate 222 with a double-membrane arrangement 210, 224 and a counterelectrode structure 228 situated therebetween.

In accordance with a thirteenth aspect referring to the twelfth aspect, in the method 100, the MEMS component 200 can be configured as a vacuum microphone.

In accordance with a fourteenth aspect referring to the first aspect, in the method 100, when carrying out 160 the HDP layer deposition, furthermore an initial step can be carried out before the first substep, wherein the initial step involves partly backsputtering the first covering layer 240 in the region 230-A of the access opening 230.

In accordance with a fifteenth aspect referring to the fourteenth aspect, in the method 100, the process parameters of the HDP layer deposition can be chosen so as to set the composition of the process gas used in the initial step such that the backsputtering is carried out with an at least reduced material application.

In accordance with a sixteenth aspect referring to the fifteenth aspect, in the method 100, the process parameters of the HDP layer deposition can be set such that the initial step is carried out without material application.

In accordance with a seventeenth aspect, a MEMS component 200 can have the following features: a layer arrangement 221 having a first layer structure 210 and a cavity 220 arranged adjacent to the first layer structure 210, wherein the first layer structure 210 has an access opening 230 to the cavity 220, and a structured covering layer stack 260; 261 for forming a local sealing element 280 at the access opening 230, wherein the local sealing element 280 has a layer sequence comprising a CVD layer 240 and an HDP layer 250.

In accordance with an eighteenth aspect referring to the seventeenth aspect, in the MEMS component 200, the MEMS component can be configured as a vacuum microphone and can have a MEMS layer system 221 on a carrier substrate 222 with a double-membrane arrangement 210; 224 and a counterelectrode structure 228 situated therebetween.

While exemplary embodiments are suitable for various modifications and alternative forms, accordingly exemplary embodiments of same are shown by way of example in the figures and described thoroughly here. It goes without saying, however, that the intention is not to limit exemplary embodiments to the specific forms disclosed, rather on the contrary the exemplary embodiments are intended to cover all modifications, counterparts and alternatives that fall within the scope of the disclosure. Throughout the description of the figures, identical reference signs refer to identical or similar elements.

It goes without saying that if one element is designated as "connected" or "coupled" to another element, it can be connected or coupled directly to the other element or intermediate elements can be present. If, in contrast, one element is designated as "connected" or "coupled" "directly" to another element, no intermediate elements are present. Other expressions used for describing the relationship between elements should be interpreted in a similar way (e.g. "between" vis à vis "directly between", "adjacent" vis à vis "directly adjacent" etc.).

It furthermore goes without saying that if one element is designated as "arranged at, on, above, alongside, below or beneath another element", this element can be arranged directly at, on, above, alongside, below or beneath the other element or one or more intermediate elements can be present. If, in contrast thereto, one element is designated as arranged "directly" at, on, above, alongside, below or beneath another element, no intermediate elements are present. Furthermore, it is pointed out that the terms used "above or vertically above, alongside, below, beneath, laterally and vertically with respect to" refer to the relative arrangement of different elements with respect to one another in relation to the respectively illustrated plane of the drawing in the different figures and should be understood in accordance with the respective illustration.

Furthermore, the formulation "at least one" element should be understood to mean that one element or a plurality of elements can be provided.

The terminology used here is intended only to describe specific exemplary embodiments and is not intended to have a limiting effect for exemplary embodiments. According to usage herein, the singular forms "a, an" and "the" are also intended to encompass the plural forms, unless clearly indicated otherwise in the context. It furthermore goes without saying that the terms "comprises", "comprising", "have" and/or "having" in the usage herein indicate the presence of indicated features, integers, steps, operations, elements and/or constituents, but do not exclude the presence or addition of one or more other features, integers, steps, operations, elements, constituents and/or groups thereof.

Unless defined otherwise, all terms used here (including technical and scientific terms) have the same meaning as is normally understood by a person of average skill in the art in the field to which exemplary embodiments belong. Furthermore, it goes without saying that terms, e.g. those defined in dictionaries normally used, should be interpreted as having a meaning which corresponds to their meaning in the context of the corresponding technical area. However, if the present disclosure gives a term a specific meaning that deviates from a meaning such as is normally understood by a person of average skill in the art, said meaning should be taken into account in the specific context in which this definition is given.

In the description below, the description of an element composed of a semiconductor material means that the element comprises a semiconductor material, i.e. is formed at least partly or else completely from the semiconductor material.

Although some aspects have been described in association with a method for producing a buried cavity structure in a monocrystalline semiconductor substrate, it goes without saying that these aspects also constitute a description of the corresponding device for producing a buried cavity structure in a monocrystalline semiconductor substrate, such that a method step or a feature of a method step should also be understood as a corresponding block or a component of a corresponding device. Some or all of the method steps can be carried out by a hardware apparatus (or using a hardware apparatus), such as using a microprocessor, a programmable computer or an electronic circuit. In some exemplary embodiments, some or a plurality of the most important method steps can be carried out by such an apparatus.

In the detailed description above, in some instances different features have been grouped together in examples in order to rationalize the disclosure. This type of disclosure ought not be interpreted as the intention that the claimed examples have more features than are expressly indicated in each claim. Rather, as represented by the following claims, the subject matter can reside in fewer than all features of an individual example disclosed. Consequently, the claims that follow are hereby incorporated in the detailed description, wherein each claim can be representative of a dedicated separate example. While each claim can be representative of a dedicated separate example, it should be noted that although dependent claims refer back in the claims to a specific combination with one or more other claims, other examples also comprise a combination of dependent claims with the subject matter of any other dependent claim or a combination of each feature with other dependent or independent claims. Such combinations shall be encompassed, unless an explanation is given that a specific combination is not intended. Furthermore, the intention is for a combination of features of a claim with any other independent claim also to be encompassed, even if this claim is not directly dependent on the independent claim.

The exemplary embodiments described above merely constitute an illustration of the principles of the present exemplary embodiments. It goes without saying that modifications and variations of the arrangements and details described herein will be apparent to others skilled in the art. Therefore, the intention is for the exemplary embodiments to be restricted only by the scope of protection of the following patent claims, and not by the specific details that have been presented on the basis of the description and the explanation of the exemplary embodiments herein.

What is claimed is:

1. A method for sealing an access opening to a cavity, comprising the following steps:
    providing a layer arrangement having a first layer structure and a cavity arranged adjacent to the first layer structure, wherein the first layer structure has an access opening to the cavity,
    performing a CVD layer deposition for forming a first covering layer having a layer thickness on the first layer structure having the access opening, and
    performing an HDP layer deposition with a first and second substep for forming a second covering layer on the first covering layer,
    wherein the first substep comprises depositing a liner material layer on the first covering layer,
    wherein the second substep comprises partly backsputtering the liner material layer and furthermore the first covering layer in a region of the access opening,
    wherein the first and second substeps are carried out alternately and repeatedly a number of times, and
    wherein the liner material layer extends only as far as a lower edge of the access opening.

2. The method as claimed in claim 1, wherein, when performing the HDP layer deposition, the access opening through the first layer structure to the cavity is hermetically sealed at an atmospheric reduced pressure, and a cavity having the atmospheric reduced pressure is obtained.

3. The method as claimed in claim 1, wherein process parameters of the HDP layer deposition are set such that in the first substep and at least reduced sputtering power is set in order to perform the liner material layer deposition, and
    in the second substep a composition of a process gas used is set to perform the backsputtering with an at least reduced material application.

4. The method as claimed in claim 3, wherein the process parameters of the HDP layer deposition are set such that
    the first substep is performed without sputtering power, and
    the second substep is performed without material application.

5. The method as claimed in claim 1, wherein the access opening has a diameter, and wherein the layer thickness of the first covering layer is chosen in order to obtain a size ratio between a layer thickness $D_{240}$ of the first covering layer and an inner minimum diameter of the access opening which is in the range of between 0.3 and 1.0.

6. The method as claimed in claim 1, wherein the access opening is configured as a regular convex polygon.

7. The method as claimed in claim 1, further comprising the following step:
    applying a further seal layer on the second covering layer to form a covering layer stack.

8. The method as claimed in claim 7, further comprising the following step:
structuring the covering layer stack, to form a local sealing element at the access opening.

9. The method as claimed in claim 1, wherein the first layer structure has a plurality of access openings to the cavity, wherein, when performing the HDP layer deposition, the plurality of access openings through the first layer structure to the cavity are hermetically sealed and an atmospheric reduced pressure is formed in the cavity.

10. The method as claimed in claim 1, wherein the layer arrangement has a second layer structure that is spaced apart from the first layer structure, and wherein the cavity is arranged at least in sections between the first and second layer structures, wherein the second layer structure furthermore has at least one access opening to the cavity, and
wherein, when performing the CVD layer deposition, a first covering layer having the layer thickness is formed on the second layer structure having the at least one access opening, and
wherein, when performing the HDP layer deposition, a second continuous covering layer is formed on the first covering layer of the second layer structure.

11. The method as claimed in claim 10, wherein the second layer structure has a plurality of further access openings to the cavity, and wherein, when performing the HDP layer deposition, the plurality of further access openings through the second layer structure to the cavity are hermetically sealed and an atmospheric reduced pressure is formed in the cavity.

12. The method as claimed in claim 1, wherein the layer arrangement is part of a MEMS component having a MEMS layer system on a carrier substrate with a double-membrane arrangement and a counter electrode structure situated therebetween.

13. The method as claimed in claim 12, wherein the MEMS component is configured as a vacuum microphone.

14. The MEMS component formed by the method of claim 12.

15. The method as claimed in claim 1 wherein, when performing the HDP layer deposition, an initial step is carried out before the first substep, wherein the initial step comprises partly backsputtering the first covering layer in the region of the access opening.

16. The method as claimed in claim 15, wherein process parameters of the HDP layer deposition are chosen to set a composition of a process gas used in the initial step such that the backsputtering is performed with an at least reduced material application.

17. The method as claimed in claim 16, wherein the process parameters of the HDP layer deposition are set such that the initial step is carried out without material application.

18. A MEMS component comprising:
a layer arrangement having a first layer structure and a cavity arranged adjacent to the first layer structure, wherein the first layer structure has an access opening to the cavity; and
a structured covering layer stack for forming a local sealing element at the access opening, wherein the local sealing element has a layer sequence comprising a CVD layer and an HDP layer,
wherein the structured covering layer stack partially extends into the access opening only as far as a lower edge of the access opening.

19. The MEMS component as claimed in claim 18, wherein the MEMS component is configured as a vacuum microphone and has a MEMS layer system on a carrier substrate with a double-membrane arrangement and a counter electrode structure situated therebetween.

20. A method of forming a MEMS component, the method comprising:
forming a layer arrangement having a first layer structure and a cavity arranged adjacent to the first layer structure, wherein the first layer structure has an access opening to the cavity; and
forming a structured covering layer stack for forming a local sealing element at the access opening, wherein the local sealing element has a layer sequence comprising a CVD layer and an HDP layer,
wherein the structured covering layer stack is formed to partially extend into the access opening only as far as a lower edge of the access opening.

* * * * *